United States Patent
Martwick et al.

(10) Patent No.: US 9,141,466 B2
(45) Date of Patent: Sep. 22, 2015

(54) CORRECTING DOUBLE-BIT BURST ERRORS USING A LOW DENSITY PARITY CHECK TECHNIQUE

(75) Inventors: Andrew W. Martwick, Portland, OR (US); Terry Fletcher, Rancho Cordova, CA (US)

(73) Assignee: Intel Corporation, Santa Clara, CA (US)

( * ) Notice: Subject to any disclaimer, the term of this patent is extended or adjusted under 35 U.S.C. 154(b) by 803 days.

(21) Appl. No.: 12/651,323

(22) Filed: Dec. 31, 2009

(65) Prior Publication Data

US 2011/0161773 A1    Jun. 30, 2011

(51) Int. Cl.
  *G06F 11/00* (2006.01)
  *G06F 11/10* (2006.01)
  *H03M 13/13* (2006.01)
  *H04L 1/00* (2006.01)
  *H03M 13/17* (2006.01)

(52) U.S. Cl.
  CPC .............. *G06F 11/10* (2013.01); *H03M 13/13* (2013.01); *H04L 1/0045* (2013.01); *H04L 1/0057* (2013.01); *H03M 13/17* (2013.01)

(58) Field of Classification Search
  CPC ............... H04L 1/0057; H04L 2027/0065; H04L 25/0232; H04L 27/0008; H04L 5/026; H04L 1/0071; H04L 1/0083; H03M 13/17; H03M 13/00; H03M 13/09; H03M 13/27; G06F 11/10; G06F 11/1028

USPC .................................................. 714/755, 762
See application file for complete search history.

(56) References Cited

U.S. PATENT DOCUMENTS

| | | | | |
|---|---|---|---|---|
| 5,657,331 | A  * | 8/1997 | Metzner et al. | 714/762 |
| 6,519,734 | B1 * | 2/2003 | Bodnar et al. | 714/761 |
| 6,532,565 | B1 * | 3/2003 | Roth et al. | 714/761 |
| 7,620,873 | B2 * | 11/2009 | Kanaoka et al. | 714/752 |
| 7,831,895 | B2 * | 11/2010 | Lin | 714/800 |
| 2003/0023930 | A1 * | 1/2003 | Fujiwara et al. | 714/788 |
| 2005/0204272 | A1 * | 9/2005 | Yamagishi | 714/801 |
| 2009/0055704 | A1 * | 2/2009 | Saito et al. | 714/752 |
| 2010/0211857 | A1 * | 8/2010 | Kobayashi | 714/784 |

OTHER PUBLICATIONS

Improvement of Burst Error Correction Using a Look-Up Table with Low Density Parity Check Coding for Compressed Ultraspectral Sounder Data. Date of Conference: Feb. 20-22, 2006, Author(s): Bormin Huang; Sriraja, Y.; Hung-Lung Huang; Goldberg, M.D. pp. 1172-1176.*

* cited by examiner

*Primary Examiner* — Bryce Bonzo
*Assistant Examiner* — Elmira Mehrmanesh
(74) *Attorney, Agent, or Firm* — Thomas R. Lane

(57) ABSTRACT

Embodiments of systems, apparatuses, and methods for correcting double bit burst errors using a low density parity check technique are disclosed. In one embodiment, an apparatus includes an encoder to generate a parity vector by multiplying a first version of a data vector by a matrix. The parity vector is to identify correctable double-bit burst errors in a second version of the data vector. The apparatus also includes logic to concatenate the parity vector and the first version of the data vector.

19 Claims, 2 Drawing Sheets

Method 200

CORRECTING DOUBLE-BIT BURST ERRORS USING A LOW DENSITY PARITY CHECK TECHNIQUE

BACKGROUND

1. Field

The present disclosure pertains to the field of information processing, and more particularly, to the field of error detection and correction in information processing systems.

2. Description of Related Art

Personal computer and other information processing systems often include mechanisms for detecting, and sometimes correcting, errors in information being transmitted or stored. These mechanisms may involve the generation of parity bits or error-correcting-code (ECC) bits based on a number of data bits, and the concatenation of these parity or ECC bits with the data bits prior to transmission or storage. Following transmission or storage, an operation may be performed on the data bits along with the parity or ECC bits to generate a "syndrome" that may indicate whether one or more of the data bits has been corrupted, and if so, which data bit or bits have been corrupted. Corrupted data bits may be inverted to correct the data.

Various techniques may be used for error correction and detection. Generally, a trade-off exists between the number of parity or ECC bits per data bit and the level of error correction and detection that is possible. Therefore, different techniques may be used for different applications. Selection of an appropriate technique may depend on an evaluation of cost versus reliability.

BRIEF DESCRIPTION OF THE FIGURES

The present invention is illustrated by way of example and not limitation in the accompanying figures.

DETAILED DESCRIPTION

Embodiments of systems, apparatuses, and methods, for correcting double-bit burst errors using a low density parity check technique are described. In this description, numerous specific details, such as component and system configurations, may be set forth in order to provide a more thorough understanding of the present invention. It will be appreciated, however, by one skilled in the art, that the invention may be practiced without such specific details. Additionally, some well known structures, circuits, and the like have not been shown in detail, to avoid unnecessarily obscuring the present invention.

Embodiments of the present invention may provide for detecting and correcting single bit errors and double-bit burst errors and for detecting three-bit errors and other two-bit errors in twenty-one-bit data vectors using seven parity bits. Therefore, it may be desirable to use embodiments of the present invention in applications involving data transmission that may be susceptible to the corruption a single data bit or of two consecutive data bits. The susceptibility of the transmission may be based on the typical duration of the error-causing event relative to the transmission frequency. For example, it may be desirable to use embodiments of the present invention when radio frequency interference, electrostatic discharge, power delivery events, and/or cross talk may be of concern.

Figure 1:
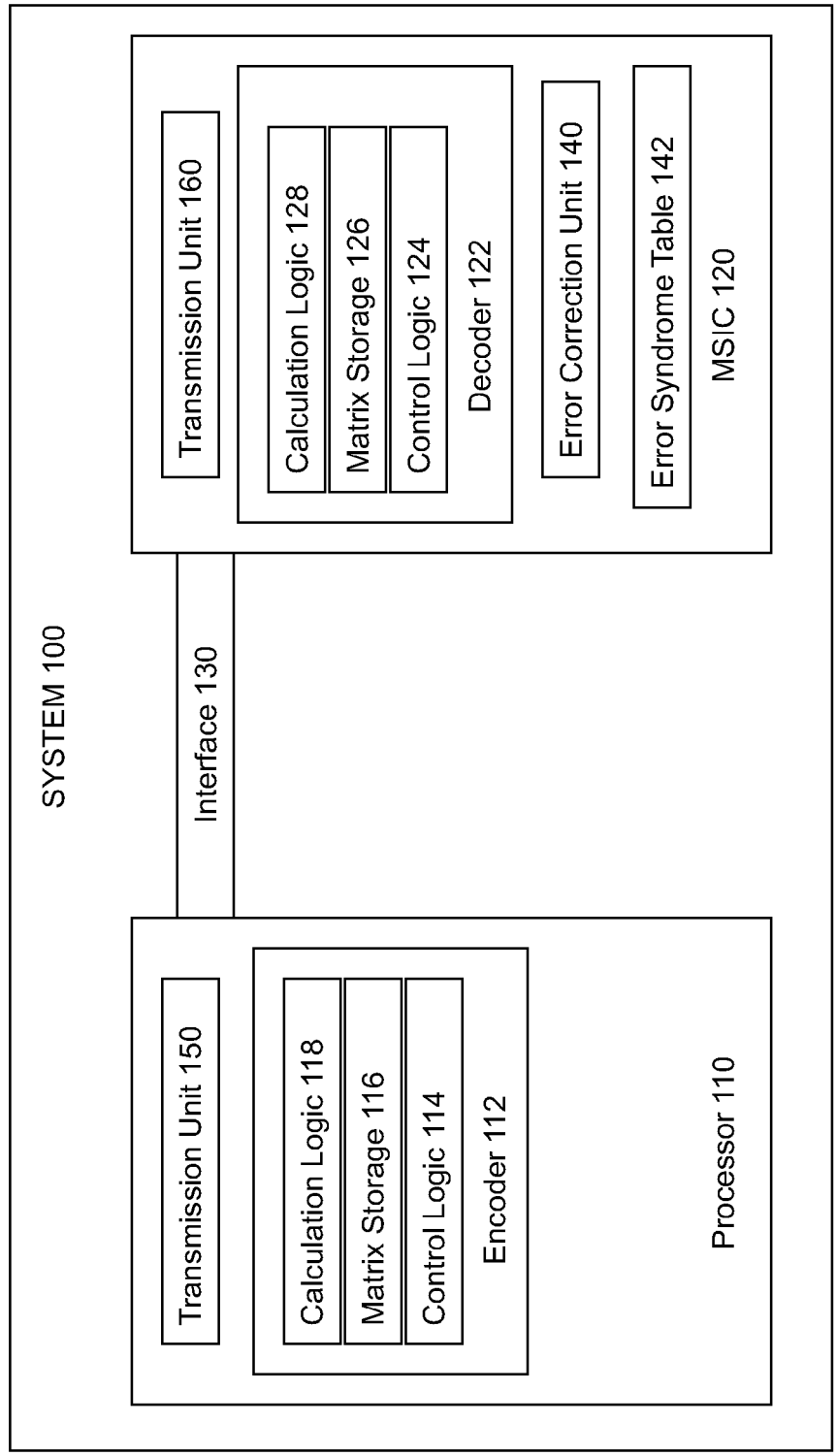
FIG. 1 illustrates a system for correcting double-bit burst errors using a low density parity check technique according to an embodiment of the present invention.

FIG. 1 illustrates an embodiment of the present invention in a system, specifically information processing system 100. Information processing system 100 may be any information processing apparatus capable of executing any software or firmware. For example, information processing system 100 may represent a personal computer, a mainframe computer, a portable computer, a server, a handheld device, a set-top box, a smart phone, or any other computing system. Information processing system 100 includes processor 110, mixed signal integrated circuit ("MSIC") 120, and interface 130. Information processing system 100 may also include any number of additional components or connections.

Processor 110 may be any type of processor, including a general purpose microprocessor, such as a processor in the Intel® Pentium® Processor Family, Itanium® Processor Family, Core® Processor Family or other processor family from Intel® Corporation, or another processor from another company, or a digital signal processor or microcontroller. Processor 110 may include multiple execution threads and multiple execution cores, in any combination. Although FIG. 1 shows one processor, information processing system 100 may include any number of processors.

MSIC 120 may be any type of component that includes digital circuits and analog circuits. MSIC 120 may be coupled to or communicate with processor 110 through interface 130, which may represent any type of serial or parallel bus, point-to-point, or other wired or wireless connections. Although FIG. 1 shows processor 110 and MSIC 120 in system 100, embodiments of the present invention may be used between any types of components in the same system or in different systems.

Processor 110 may include encoder 112, and MSIC 120 may include decoder 122. In other embodiments, processor 110 may include a decoder instead of or in addition to encoder 112, and/or MSIC 120 may include an encoder instead of or in addition to decoder 122. To the extent that any logic, circuitry, or other hardware or structures in encoder 112 and decoder 122 are redundant, a component may have an encoder and a decoder sharing a single copy of each redundant feature. A component having a decoder (e.g., MSIC 120) may also include an error correction unit (e.g., error correction unit 140) and an error syndrome table (e.g., error syndrome table 142) to correct any correctable errors detected by decoder 122.

Encoder 112 may include any logic, circuitry, or other hardware or structures to encode data as described below. For example, encoder 112 may include encoder control logic 114, matrix storage location 116, and calculation logic 118. Encoder 112 may include dedicated logic, circuitry, or other hardware or structures, and/or may include logic, circuitry, or other hardware or structures that may be used to perform one or more other functions in processor 110. The principle of operation of encoder 112 may be based on a low density parity check technique.

Encoder control logic 114 may include any logic, circuitry, or other hardware or structures, such as microcode, state machine logic, programmable logic, or any other form of control logic, to generate control signals for, or to otherwise control encoder 112 and/or cause encoder 112 to perform encoding according to embodiments of the present invention, as described below.

Matrix storage location 116 may include any number of programmable and/or hard-wired registers or other storage locations of any size to store values representing a matrix to be used by encoder 112 in performing encoding according to embodiments of the present invention, as described below. Matrix storage location 116 may also provide temporary or scratchpad storage for encoder 112 to use in performing encoding according to embodiments of the present invention, as described below. In other embodiments, matrix values and/or temporary storage may be provided in any other storage location accessible to encoder 112, within or separate from processor 110.

Calculation logic 118 may include any logic, circuitry, or other hardware or structures, such as exclusive-OR ("XOR") gates, to perform the calculations or computations involved in encoding according to embodiments of the present invention, as described below.

Decoder 122 may include any logic, circuitry, or other hardware or structures to decode data as described below. For example, decoder 122 may include decoder control logic 124, matrix storage location 126, and calculation logic 128. Decoder 122 may include dedicated logic, circuitry, or other hardware or structures, and/or may include logic, circuitry, or other hardware or structures that may be used to perform one or more other functions in MSIC 120. The principle of operation of decoder 122 may be based on a low density parity check technique.

Decoder control logic 124 may include any logic, circuitry, or other hardware or structures, such as microcode, state machine logic, programmable logic, or any other form of control logic, to generate control signals for, or to otherwise control decoder 122 and/or cause decoder 122 to perform decoding according to embodiments of the present invention, as described below.

Matrix storage location 126 may include any number of programmable and/or hard-wired registers or other storage locations of any size to store values representing a matrix to be used by decoder 122 in performing decoding according to embodiments of the present invention, as described below. Matrix storage location 126 may also provide temporary or scratchpad storage for decoder 122 to use in performing decoding according to embodiments of the present invention, as described below. In other embodiments, matrix values and/or temporary storage may be provided in any other storage location accessible to decoder 122, within or separate from MSIC 120.

Calculation logic 128 may include any logic, circuitry, or other hardware or structures, such as exclusive-OR ("XOR") gates, to perform the calculations or computations involved in decoding according to embodiments of the present invention, as described below.

Matrix storage locations 116 and 126 may be used to store the following matrix having twenty-one rows and seven columns (the "generating matrix" or "G"):

```
Row 0:  0 0 1 1 1 1 1
Row 1:  1 1 1 0 0 0 0
Row 2:  1 0 1 0 0 0 1
Row 3:  1 0 1 0 1 0 0
Row 4:  1 1 0 0 0 0 1
Row 5:  1 0 0 0 1 0 1
Row 6:  1 0 1 0 0 1 0
Row 7:  1 0 0 0 1 1 0
Row 8:  1 0 1 1 0 0 0
Row 9:  1 0 0 0 0 1 1
Row 10: 0 0 1 1 0 0 1
Row 11: 1 1 0 0 0 1 0
Row 12: 1 1 0 1 0 0 0
Row 13: 0 0 1 1 1 0 0
Row 14: 0 0 1 0 0 1 1
Row 15: 0 0 1 1 0 1 0
Row 16: 1 1 1 1 1 0 0
Row 17: 0 0 1 0 1 1 0
Row 18: 1 1 0 0 1 0 0
Row 19: 0 0 0 0 1 1 1
Row 20: 0 0 1 0 1 0 1
```

The generating matrix may be used by encoder 112 to perform the following operation on twenty-one bit data vectors (each, a "data vector" or "D") to generate a seven-bit parity vector for each data vector (each, a "parity vector" or "P").

$$P=D*G$$

In other words, the lowest order bit of the parity vector ("P0") is generated using the values from the first column of the generation matrix. P0 is the sum (i.e., XOR) of the products (i.e., AND) of each bit of the data vector and the corresponding bit of the first column of the generation matrix, where the top row (row 0) of the generation matrix corresponds to the lowest order bit (D0) of the data vector. For example, if the data vector is '000000000000000000000' and the first column of the generation matrix is '011111111101100010100' then P0 will be '0*0+0*1+0*1+0*1+0*1+0*1+0*1+0*1+0*1+0*1+0*0+0*1+0*1+0*0+0*0+0*0+0*1+0*0+0*1+0*0+0*0' which equals '0+0+0+0+0+0+0+0+0+0+0+0+0+0+0+0+0+0+0+0+0' which equals zero. For example, if the data vector is '111111111111111111111' and the first column of the generation matrix is '011111111101100010100' then P0 will be '1*0+1*1+1*1+1*1+1*1+1*1+1*1+1*1+1*1+1*1+1*0+1*1+1*1+1*0+1*0+1*0+1*1+1*0+1*1+1*0+1*0' which equals '0+1+1+1+1+1+1+1+1+1+0+1+1+0+0+0+1+0+1+0+0' which equals one because it is an odd number (13) of ones. The remaining bits of the parity vector are calculated accordingly.

Each seven-bit parity vector is concatenated with the corresponding twenty-one bit data vector to form a twenty-eight bit vector to be transmitted from processor 110 to MSIC 120; therefore, the encoding process is referred to as a (28, 21) code. The twenty-eight bit vector for transmission is ordered from the lowest order bit in the data vector to the highest order bit in the data vector, followed by the lowest order bit in the parity vector to the highest order bit in the parity vector (i.e., D0, D1, D2, D3, D4, D5, D6, D7, D8, D9, D10, D11, D12, D13, D14, D15, D16, D17, D18, D19, D20, P0, P1, P2, P3, P4, P5, P6).

Processor 110 may include transmission unit 150, which may include any logic, circuitry, or other hardware or structures, such as output buffers, to transmit the concatenated vector to MSIC 120 through interface 130. MSIC 120 may include transmission unit 160, which may include any logic, circuitry, or other hardware or structures, such as input buffers, to receive the transmission through interface 130 from processor 110.

The generating matrix may be also be used by decoder 122 to perform the following operation on the first twenty-one bits (i.e., length of data vector) of each vector received (each, a "received vector" or "V") to generate a seven-bit check vector for each received vector (each, a "check vector" or "C"), as part of the error detection process.

$$C = V * G$$

In other words, the check vector is calculated according to the same operation as the parity vector. Then, a seven-bit error syndrome ("E") may be found by the adding (i.e., XORing) the seven-bit check vector with the last seven bits of the received vector (i.e., the parity bits, as received). If the value of the resulting error syndrome is zero, then the data vector has been transmitted with no error (or possibly an undetected error of more than two bits or of two non-consecutive bits).

However, if the value of the resulting error syndrome is non-zero, then the error syndrome may be used to identify the bit location of the error according to the following table, where the error syndrome is listed in hexadecimal notation.

| Error Syndrome: | Type of Error: | Bit Location of Error(s): |
|---|---|---|
| 7C | single | D0 |
| 07 | single | D1 |
| 45 | single | D2 |
| 15 | single | D3 |
| 43 | single | D4 |
| 51 | single | D5 |
| 25 | single | D6 |
| 31 | single | D7 |
| 0D | single | D8 |
| 61 | single | D9 |
| 4C | single | D10 |
| 23 | single | D11 |
| 0B | single | D12 |
| 1C | single | D13 |
| 64 | single | D14 |
| 2C | single | D15 |
| 1F | single | D16 |
| 34 | single | D17 |
| 13 | single | D18 |
| 70 | single | D19 |
| 54 | single | D20 |
| 01 | single | P0 |
| 02 | single | P1 |
| 04 | single | P2 |
| 08 | single | P3 |
| 10 | single | P4 |
| 20 | single | P5 |
| 40 | single | P6 |
| 7B | double burst | D0, D1 |
| 42 | double burst | D1, D2 |
| 50 | double burst | D2, D3 |
| 56 | double burst | D3, D4 |
| 12 | double burst | D4, D5 |
| 74 | double burst | D5, D6 |
| 14 | double burst | D6, D7 |
| 3C | double burst | D7, D8 |
| 6C | double burst | D8, D9 |
| 2D | double burst | D9, D10 |
| 6F | double burst | D10, D11 |
| 28 | double burst | D11, D12 |
| 17 | double burst | D12, D13 |
| 78 | double burst | D13, D14 |
| 48 | double burst | D14, D15 |
| 33 | double burst | D15, D16 |
| 2B | double burst | D16, D17 |
| 27 | double burst | D17, D18 |
| 63 | double burst | D18, D19 |
| 24 | double burst | D19, D20 |
| 55 | double burst | D20, P0 |

-continued

| Error Syndrome: | Type of Error: | Bit Location of Error(s): |
|---|---|---|
| 03 | double burst | P0, P1 |
| 06 | double burst | P1, P2 |
| 0C | double burst | P2, P3 |
| 18 | double burst | P3, P4 |
| 30 | double burst | P4, P5 |
| 60 | double burst | P5, P6 |

Error correction unit 140 may include any logic, circuitry, or other hardware or structures, such as bit comparators and inverters, to compare the error syndrome to zero and to correct any correctable errors detected by decoder 122, for example, by inverting the values in the bit locations where errors were found. Errors in parity bit locations may be ignored. Any error syndrome not shown in the error syndrome table above indicates that an uncorrectable multiple bit error has occurred. Error correction unit 140 may be within or otherwise combined with decoder 122.

Error syndrome table 142 may include any number of programmable or hard-wired registers and/or other storage locations of any size to store values representing an error table, such as the error table shown above, to be used by error correction unit 130 in performing error correction according to embodiments of the present invention, as described above. In other embodiments, matrix values and/or temporary storage may be provided in any other storage location accessible to decoder 122, within or separate from MSIC 120.

Figure 2:
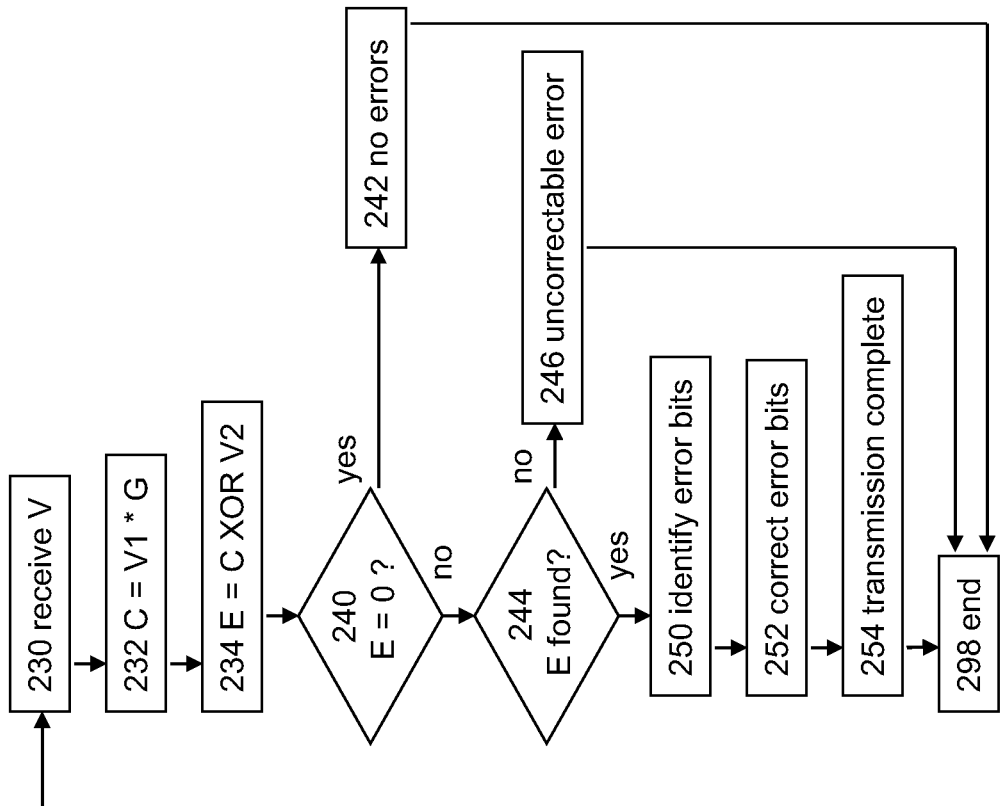
FIG. 2 illustrates a method for correcting double-bit burst errors according to an embodiment of the present invention.
Figure 2:
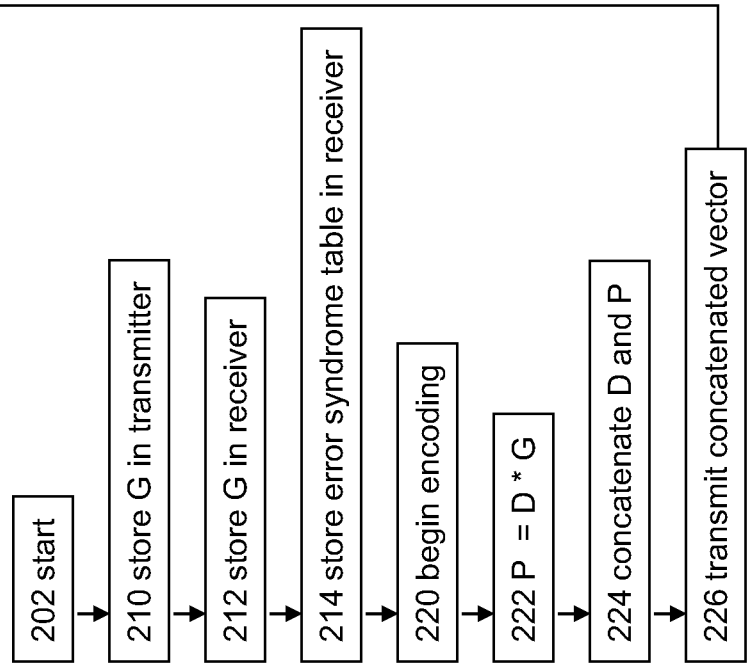

FIG. 2 illustrates an embodiment of the present invention in a method, specifically method 200 for correcting double-bit burst errors using a low density parity check technique. In the following description of method 200, references may be made to elements of FIG. 1; however, method embodiments of the present invention are not limited in this respect.

In box 202 of FIG. 2, method 200 may begin.

In box 210, a generating matrix according to an embodiment of the present invention may be stored in a matrix storage location accessible to an encoder in a first component. In box 212, a generating matrix according to an embodiment of the present invention may be stored in a matrix storage location accessible to a decoder in a second component. In box 214, an error syndrome table according to an embodiment of the present invention may be stored in an error syndrome table storage location accessible to an error correction unit in the second component.

In box 220, encoding of a data vector by the first component, using a low density parity check technique, may begin. In box 222, the scalar data vector may be multiplied with the generating matrix to generate a scalar parity vector. In box 224, the parity vector may be concatenated with the data vector. In box 226, the concatenated vector may be transmitted from the first component to the second component.

In box 230, the transmission may be received by the second component in the form of a received vector. In box 232, a first portion of the scalar received vector, corresponding to the length of the data vector, may be multiplied with the generating matrix to generate a scalar check vector. In box 234, each bit of the check vector may be XORed with a second portion of the received vector, corresponding to the length of the parity vector, to generate an error syndrome.

In box 240, the error syndrome may be compared to zero. If the error syndrome equals zero, then, in box 242, the transmission may be assumed to be complete with no errors. If not, then, in box 244, the error syndrome table is searched for the error syndrome. If the error syndrome is not found, then, in box 246, the received vector has been determined to include an uncorrectable error and an error procedure, which may include repeating the transmission, may be invoked.

However, if the error syndrome is found in the error syndrome table, then, in box 250, the bit location or locations of the error are identified from the error syndrome table. In box 252, the error is corrected, for example, by inverting the values in the bit locations identified from the error syndrome table. In box 254, the transmission has been completed and the errors corrected.

In box 298 of FIG. 2, method 200 may end.

Within the scope of the present invention, the method illustrated in FIG. 2 and/or the actions taken in performing method 200 may be performed together or separately, in a different order, with illustrated boxes omitted, with additional boxes added, or with a combination of reordered, omitted, or additional boxes. For example, boxes 232 and 234 may be combined into one operation.

Thus, embodiments of systems, apparatuses, and methods for correcting double-bit burst errors using a low density parity check technique have been described. While certain embodiments have been described, and shown in the accompanying drawings, it is to be understood that such embodiments are merely illustrative and not restrictive of the broad invention, and that this invention not be limited to the specific constructions and arrangements shown and described, since various other modifications may occur to those ordinarily skilled in the art upon studying this disclosure. In an area of technology such as this, where growth is fast and further advancements are not easily foreseen, the disclosed embodiments may be readily modifiable in arrangement and detail as facilitated by enabling technological advancements without departing from the principles of the present disclosure or the scope of the accompanying claims.

What is claimed is:

1. An apparatus comprising:
    an encoder to generate a parity vector by multiplying a first version of a data vector by a matrix, the parity vector to identify correctable double-bit burst errors in a second version of the data vector, the matrix having a first number of rows and a second number of columns, the first number different than the second number, the first number equal to twenty-one and the second number equal to seven; and
    logic to concatenate the parity vector and the first version of the data vector.

2. The apparatus of claim 1, wherein the second version of the data vector is created by transmission of the first data vector.

3. The apparatus of claim 1, further comprising a transmission unit to transmit the concatenated vector.

4. The apparatus of claim 1, further comprising a matrix storage location to store the matrix.

5. The apparatus of claim 1, wherein the data vector has a length of twenty-one bits.

6. The apparatus of claim 1, wherein the parity vector has a length of seven bits.

7. A method comprising:
    generating, by an encoder in a processor, a parity vector by multiplying a first version of a data vector by a matrix, the parity vector to identify correctable double-bit burst errors in a second version of the data vector, the matrix having a first number of rows and a second number of columns, the first number different than the second number, the first number equal to twenty-one and the second number equal to seven;
    concatenating the parity vector and the first version of the data vector; and
    storing the concatenated vector in the processor.

8. The method of claim 7, further comprising transmitting, by the processor, the concatenated vector to a receiving component.

9. The method of claim 8, further comprising receiving, by the receiving component, a received vector in response to the processor transmitting the concatenated vector.

10. The method of claim 9, further comprising generating a check vector by multiplying a first portion of the received vector by the matrix.

11. The method of claim 10, further comprising generating an error syndrome by logically combining the check vector with a second portion of the received vector.

12. The method of claim 11, further comprising searching an error syndrome table for the error syndrome.

13. The method of claim 12, further comprising identifying a double-bit burst error in the received vector based on the error syndrome table.

14. The method of claim 13, further comprising correcting the double-bit burst error.

15. A system comprising:
    a transmitting component including
        an encoder to generate a parity vector by multiplying a data vector by a matrix, the matrix having a first number of rows and a second number of columns, the first number different than the second number, the first number equal to twenty-one and the second number equal to seven;
        logic to concatenate the parity vector and the data vector; and
        a transmission unit to transmit the concatenated vector; and
    a receiving component including
        a receiving unit to receive a received vector in response to the transmitting component transmitting the concatenated vector;
        a decoder to generate an error syndrome based on the received vector; and an error correction unit to correct a double-bit burst error in the received vector using the error syndrome.

16. The system of claim 15, wherein the decoder is to generate the error syndrome multiplying a first portion of the received vector with the matrix to generate a check vector, and logically combining the check vector with a second portion of the received vector to generate the error syndrome.

17. The system of claim 16, wherein the first portion of the received vector has a length equal to the length of the data vector, and the second portion of the received vector has a length equal to the length of the parity vector.

18. The system of claim 16, wherein the decoder includes exclusive-OR logic to logically combining the check vector with the second portion of the received vector to generate the error syndrome.

19. The system of claim 16, wherein the error correction logic is to search an error syndrome table to identify the double-bit burst error based on the error syndrome.

* * * * *